(12) United States Patent
Mauder et al.

(10) Patent No.: US 10,153,276 B2
(45) Date of Patent: Dec. 11, 2018

(54) GROUP III HETEROJUNCTION SEMICONDUCTOR DEVICE HAVING SILICON CARBIDE-CONTAINING LATERAL DIODE

(71) Applicant: Infineon Technologies Austria AG, Villach (AT)

(72) Inventors: Anton Mauder, Kolbermoor (DE); Khalil Hosseini, Weihmichl (DE); Frank Kahlmann, Neubiberg (DE)

(73) Assignee: Infineon Technologies Austria AG, Villach (AT)

( * ) Notice: Subject to any disclaimer, the term of this patent is extended or adjusted under 35 U.S.C. 154(b) by 115 days.

(21) Appl. No.: 14/573,062

(22) Filed: Dec. 17, 2014

(65) Prior Publication Data

US 2016/0181240 A1 Jun. 23, 2016

(51) Int. Cl.
| | |
|---|---|
| *H01L 27/07* | (2006.01) |
| *H01L 27/06* | (2006.01) |
| *H01L 29/16* | (2006.01) |
| *H01L 29/872* | (2006.01) |
| *H01L 29/417* | (2006.01) |
| *H01L 29/778* | (2006.01) |
| *H01L 21/8252* | (2006.01) |
| *H01L 21/8258* | (2006.01) |
| *H01L 29/20* | (2006.01) |

(52) U.S. Cl.
CPC ...... *H01L 27/0727* (2013.01); *H01L 21/8252* (2013.01); *H01L 21/8258* (2013.01); *H01L 27/0605* (2013.01); *H01L 27/0629* (2013.01); *H01L 27/0688* (2013.01); *H01L 29/1608* (2013.01); *H01L 29/41766* (2013.01); *H01L 29/7786* (2013.01); *H01L 29/872* (2013.01); *H01L 29/2003* (2013.01)

(58) Field of Classification Search
CPC . H01L 29/872; H01L 29/7786; H01L 29/778; H01L 29/66431; H01L 27/0727; H01L 27/0629
See application file for complete search history.

(56) References Cited

U.S. PATENT DOCUMENTS

| | | | |
|---|---|---|---|
| 7,989,277 B1 * | 8/2011 | Luh | H01L 21/8252 257/E21.047 |
| 8,581,301 B2 | 11/2013 | Saito et al. | |
| 2011/0204417 A1 * | 8/2011 | Sato | H01L 21/78 257/190 |

(Continued)

FOREIGN PATENT DOCUMENTS

| | | |
|---|---|---|
| CN | 102308390 A | 1/2012 |
| CN | 103367356 A | 10/2013 |
| CN | 103515383 A | 1/2014 |

OTHER PUBLICATIONS

Larheche, H. et al., "Progress in Microwave GaN HEMT Grown by MBE on Silicon and Smart Cut TM Engineered Substrates for High Power Applications", European Gallium Arsenide and Other Semiconductor Application Symposium, 2005 (EGAAS 20050, Paris, France, Oct. 3-4, 2005, pp. 369-371.

*Primary Examiner* — Michael Jung
(74) *Attorney, Agent, or Firm* — Murphy, Bilak & Homiller, PLLC

(57) ABSTRACT

In an embodiment, a semiconductor device includes a silicon carbide layer comprising a lateral diode, and a Group III nitride based semiconductor device arranged on the silicon carbide layer.

18 Claims, 7 Drawing Sheets

(56) References Cited

U.S. PATENT DOCUMENTS

| | | | | |
|---|---|---|---|---|
| 2011/0278598 A1* | 11/2011 | Renaud | ............... | H01L 21/746 257/77 |
| 2013/0221363 A1* | 8/2013 | Prechtl | ............. | H01L 29/66462 257/76 |
| 2014/0117411 A1* | 5/2014 | Kanaya | .............. | H01L 27/0629 257/195 |
| 2014/0151755 A1* | 6/2014 | Liu | ................. | H01L 29/66477 257/252 |
| 2014/0353724 A1* | 12/2014 | Fujita | .............. | H01L 21/02518 257/195 |
| 2015/0187599 A1* | 7/2015 | Ko | .................... | H01L 21/3212 438/492 |
| 2015/0263104 A1* | 9/2015 | Saito | ................. | H01L 29/1066 257/76 |
| 2016/0149022 A1* | 5/2016 | Saunders | ........... | H01L 29/0891 257/24 |

\* cited by examiner

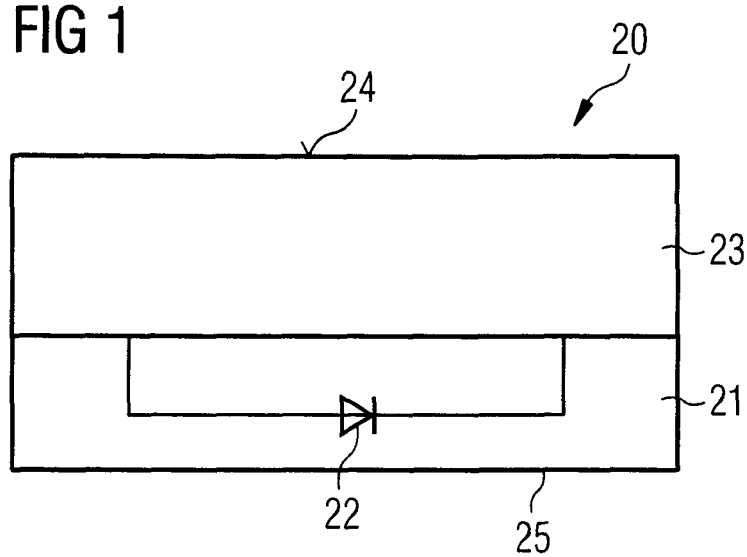
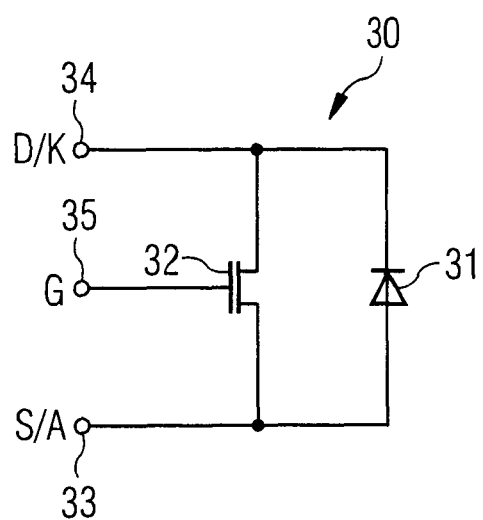

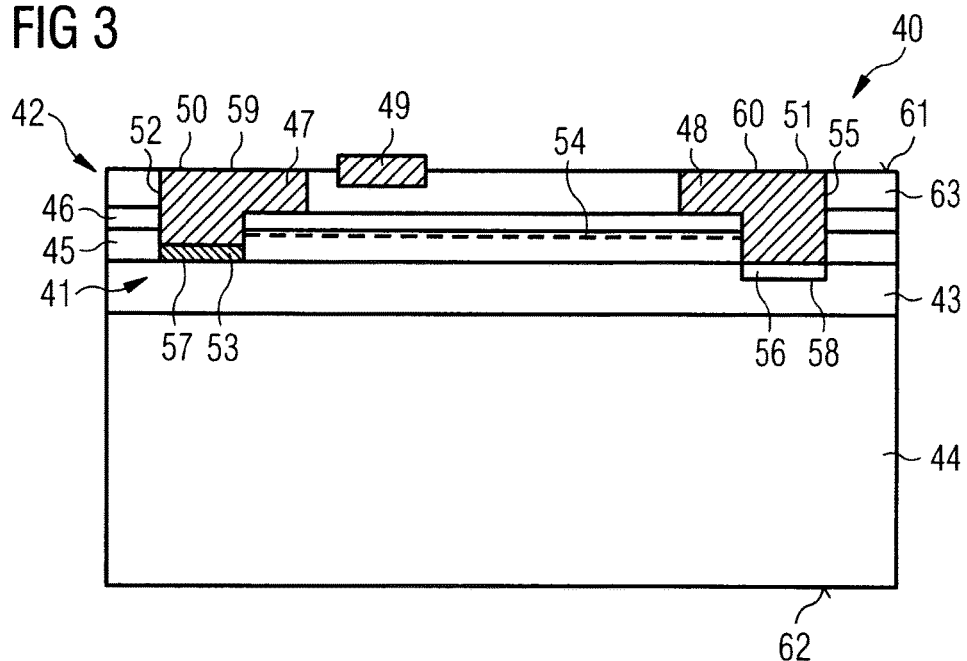
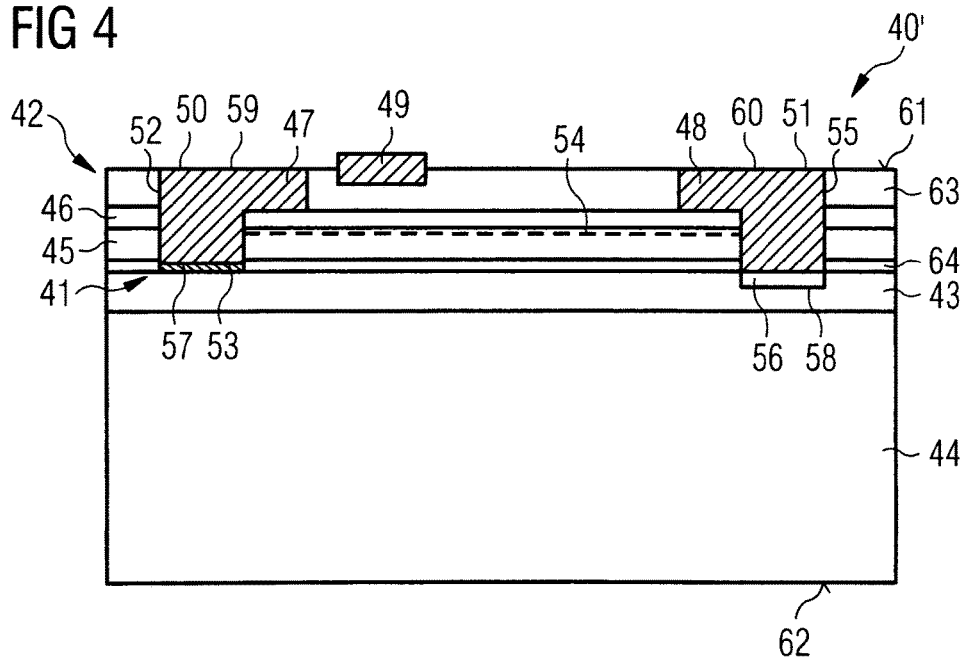

GROUP III HETEROJUNCTION SEMICONDUCTOR DEVICE HAVING SILICON CARBIDE-CONTAINING LATERAL DIODE

BACKGROUND

To date, transistors used in power electronic applications have typically been fabricated with silicon (Si) semiconductor materials. Common transistor devices for power applications include Si super-junction devices, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times.

SUMMARY

In an embodiment, a semiconductor device includes a silicon carbide layer comprising a lateral diode, and a Group III nitride based semiconductor device arranged on the silicon carbide layer.

In an embodiment, a semiconductor device includes a silicon carbide layer including a first lateral diode and a second lateral diode and a Group III nitride based semiconductor device arranged on the silicon carbide layer. The first lateral diode is coupled in parallel with the Group III nitride based semiconductor device and the second lateral diode is coupled in series with the Group III nitride based semiconductor device.

In an embodiment, a method includes forming a Group III nitride based channel layer on a silicon carbide layer, forming a Group III nitride based barrier layer on the Group III nitride based channel layer, forming a Schottky contact with the silicon carbide layer, coupling the Schottky contact with an ohmic contact coupled to Group III nitride based channel layer, forming an ohmic contact with the silicon carbide layer and coupling the ohmic contact with an ohmic contact coupled to the Group III nitride based channel layer.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1 illustrates a schematic cross-sectional view of a semiconductor device according to a first embodiment.

FIG. 2 illustrates a circuit diagram of a diode coupled in parallel with a transistor device.

FIG. 3 illustrates a semiconductor device according to a second embodiment including a diode coupled in parallel with a transistor device.

FIG. 4 illustrates a semiconductor device according to a third embodiment including a diode coupled in parallel with a transistor device.

DETAILED DESCRIPTION

Figure 5:
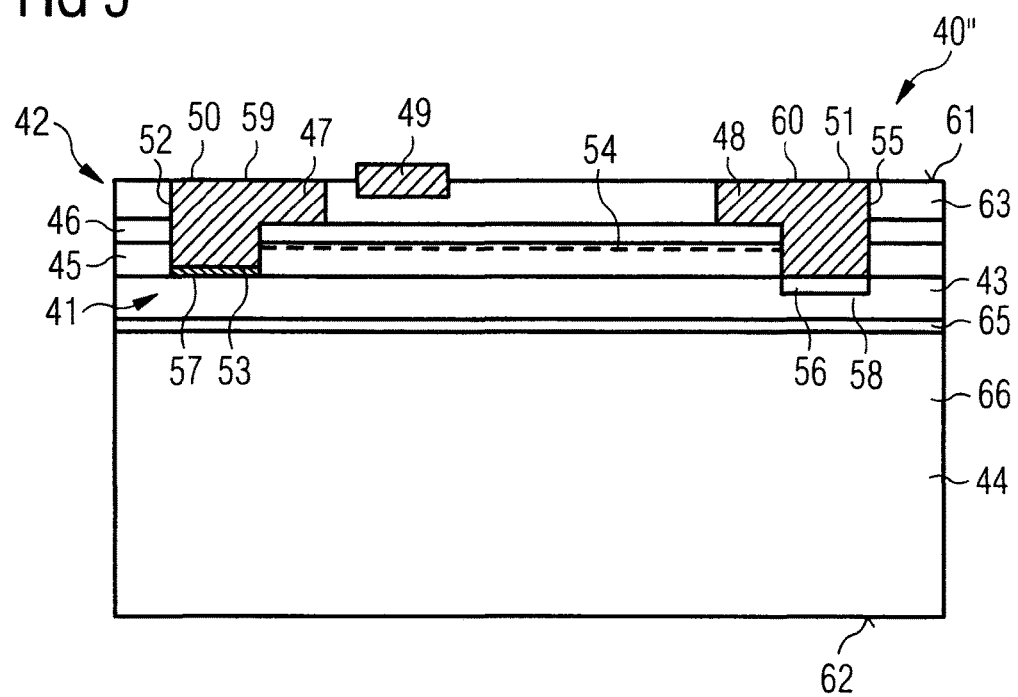
FIG. 5 illustrates a semiconductor device according to a fourth embodiment including a diode coupled in parallel with a transistor device.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

An n-channel depletion-mode device, such as a high-voltage depletion-mode transistor, has a negative threshold voltage which means that it can conduct current at zero gate voltage. These devices are normally on. An n-channel enhancement-mode device, such as a low-voltage enhancement-mode transistor, has a positive threshold voltage which means that it cannot conduct current at zero gate voltage and is normally off.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), and aluminum indium gallium arsenide phosphide nitride ($Al_x In_yGa_{(1-x-y)}As_aP_bN_{(1-a-b)}$), for example. Aluminum gallium nitride refers to an alloy described by the formula $Al_xGa_{(1-x)}N$, where x<1.

FIG. 1 illustrates a schematic cross-sectional view of a semiconductor device 20 according to a first embodiment. The semiconductor device 20 includes a silicon carbide layer 21 which includes a lateral diode 22 and a Group III nitride-based semiconductor device 23 which is arranged on the silicon carbide layer 21.

A lateral diode describes a diode with a current path which is substantially lateral and substantially parallel to one of the major surfaces 24, 25 of the semiconductor device 20. The Group III nitride-based semiconductor device 23 may be considered to be stacked on the lateral diode 22.

The lateral diode 22 may be coupled in parallel or in series with the Group III nitride-based semiconductor device 23. The Group III nitride-based semiconductor device 23 may include a high-voltage depletion mode transistor, for example. In some embodiments, the Group III nitride-based semiconductor device 23 includes a transistor device such as a High Electron Mobility Transistor (HEMT).

The lateral diode 22 may include an anode coupled by a Schottky contact with the silicon carbide layer 21 and a cathode coupled by an ohmic contact with the silicon carbide layer 21. In some embodiments, the anode of the lateral diode is coupled with the source of the Group III nitride semiconductor device 23 and the cathode is coupled with a drain of the Group III nitride-based semiconductor device 23. This arrangement may be used to couple the lateral diode 22 in parallel with a Group III nitride-based transistor device.

In some embodiments, the anode is coupled with a drain of the Group III nitride-based device and the cathode is coupled with an output of the semiconductor device 20. This arrangement may be used to couple the lateral diode 22 in series with a Group III nitride-based transistor device.

In some embodiments, the silicon carbide layer is arranged on an insulation layer which may, in turn, be arranged on the substrate. The insulation layer may include silicon dioxide and the substrate may include silicon.

In an embodiment, the semiconductor device includes a silicon carbide layer including a first lateral diode and a second lateral diode. A Group III nitride-based semiconductor device is arranged on the silicon carbide layer. The first lateral diode is coupled in parallel with the Group III nitride-based semiconductor device and the second lateral diode is coupled in series with the Group III nitride-based semiconductor device.

An anode of the first lateral diode may be coupled to a source of the Group III nitride-based semiconductor device, the cathode of the first lateral diode coupled to a drain of the Group III nitride-based semiconductor device, an anode of the second lateral diode may be coupled to the drain of the Group III nitride-based semiconductor device and a cathode of the second lateral diode coupled to an output of the semiconductor device. This arrangement may be used to couple the first lateral diode in parallel with a Group III nitride-based transistor device and the second lateral diode in series with the Group III nitride-based transistor device. The Group III nitride-based transistor device may include a High Electron Mobility Transistor (HEMT).

In an embodiment, the first lateral diode may be arranged under the Group III nitride-based semiconductor device and the second lateral diode may be arranged adjacent the Group III nitride-based semiconductor device. The Group III nitride-based semiconductor device may have a lateral extent which is less than the lateral extent of the substrate. For example, the Group III nitride-based semiconductor device may have a lateral extent such that it is arranged only over the first lateral diode. A layer which does not include an active semiconductor device may be arranged on the second lateral diode which is positioned adjacent the Group III nitride-based semiconductor device. For example, the second lateral diode may be covered by an insulation layer only, for example.

In an embodiment, the first lateral diode comprises an anode and a cathode. The anode is coupled by a Schottky contact with the silicon carbide layer and coupled by an ohmic contact to a source of the Group III nitride-based semiconductor device. The cathode of the first lateral diode may be coupled by an ohmic contact with the silicon carbide layer and by an ohmic contact with the drain of the Group III nitride-based transistor device. This embodiment may be used to electrically couple the first lateral diode in parallel with a Group III nitride-based transistor device, for example.

In an embodiment, the second lateral diode comprises an anode and a cathode. The anode may be coupled by a Schottky contact with the silicon carbide layer and an ohmic contact with a drain of the Group III nitride-based semiconductor device. The cathode of the second lateral diode may be coupled by an ohmic contact with an output of the semiconductor device. This arrangement may be used to electrically couple the second lateral diode in series with a Group III nitride-based transistor device, for example.

In an embodiment, a method includes forming a Group III nitride-based channel layer on a silicon carbide layer, forming a Group III nitride-based barrier layer on the Group III nitride-based channel layer, forming a Schottky contact with the silicon carbide layer, coupling the Schottky contact with an ohmic contact coupled to the Group III nitride-based channel layer, forming an ohmic contact with a silicon carbide layer and coupling the ohmic contact with the ohmic contact coupled to the Group III nitride-based channel layer.

The channel layer may include gallium nitride and the barrier layer may include aluminium nitride.

The substrate may include silicon carbide. In some embodiments, the substrate includes p-doped silicon carbide and the silicon carbide layer includes n-doped silicon carbide. In some embodiments the substrate includes silicon which may be subjected to an oxidation treatment to form a layer of silicon oxide $SiO_x$ or $SiO_2$ onto which the silicon carbide layer is applied.

The ohmic contact with the silicon carbide layer may be produced by highly doping a region or well at the upper surface of the silicon carbide layer, for example by implantation. After deposition of the Group III nitride-based channel layer and barrier layer, vias may be introduced to expose regions of the silicon carbide layer. Conductive material may be introduced into the vias to produce an electrical contact to the buried silicon carbide layer. The conductive material may also be used to form source and drain electrodes. The source and drain electrodes may be coupled to a two dimensional electron gas which is formed at the interface between the Group III nitride-based channel and barrier layers. A single conductive via may provide a common electrode or node, for example a source/anode node or a drain/cathode node.

The silicon carbide layer may be used to promote epitaxial growth of the Group III nitride-based barrier layer. For example, both silicon carbide and gallium nitride have a hexagonal crystal structure so that epitaxial growth of gallium nitride on the silicon nitride layer may be promoted.

FIG. 2 illustrates a circuit diagram 30 of a diode 31 coupled in parallel with a transistor device 32. The circuit 30 includes three nodes, a first node 33 which is common to the source of the transistor device 32 and the anode of the diode 31, a second node 34 which is common to the drain of the transistor device 32 and the cathode of the diode 31 and a gate node 35 which is coupled to the gate of the transistor device 32.

The circuit 30 may be provided by stacking the transistor device 32 on top of the diode 31 in a monolithic semiconductor device.

FIGS. 3 to 6 illustrate embodiments in which a gallium nitride-based Group III nitride-based transistor device, in particular, a gallium nitride-based High Electron Mobility Transistor is stacked on a silicon carbide layer which includes a diode and, in particular, a lateral diode.

FIG. 3 illustrates a semiconductor device 40 according to a second embodiment including a lateral diode 41 coupled in parallel with a transistor device, in particular a gallium nitride-based HEMT 42. The gallium nitride-based HEMT 42 is arranged on a silicon carbide layer 43 which includes the lateral diode 41. The silicon carbide layer 43 is arranged on a substrate 44. In the embodiment illustrated in FIG. 3, the substrate 44 includes silicon carbide and, in particular, p-doped silicon carbide. The silicon carbide layer 43 is n-doped.

The gallium nitride-based HEMT 42 includes a gallium nitride layer 45 arranged on the silicon carbide layer 43 and an aluminium gallium nitride layer 46 arranged on the gallium nitride layer 45. A two-dimensional electron gas (2DEG) indicated schematically with dashed line 54 is formed at the interface between the gallium nitride layer 45 and the aluminium gallium nitride layer 46 due to induced and spontaneous polarisation. The gallium nitride-based HEMT 42 includes a source 47 which is arranged on the aluminium gallium nitride layer 46, a drain 48 which is arranged on the aluminium gallium nitride layer 46 and a gate 49 which is arranged between the source 47 and drain 48. The gate 49 may include a gate oxide arranged between the gate 49 and the aluminium gallium nitride layer 46. The source 47 of the gallium nitride-based HEMT 42 forms a common electrode 59 with the anode 50 of the lateral diode 41 and the drain 48 forms a common electrode 60 with the cathode 51 of the diode 41.

The common source/anode electrode 59 is formed by via 52 which extends through the aluminium gallium nitride layer 46 and the gallium nitride layer 45 to the silicon carbide layer 43. The anode 50 is electrically coupled to the silicon carbide layer 43 by a Schottky contact 57 formed by a layer 53 of a suitable metal or alloy such as titanium which is in direct contact with the silicon carbide layer 43 arranged at the base of the via 52. The remainder of the via 52 may be at least partially filled with conductive material, such as a metal, which is electrically coupled to the two-dimensional electron gas 54 and formed the source 47 of the gallium nitride-based HEMT 42 and the common electrode 59.

Similarly, the common drain/cathode electrode 60 is formed by a via 55 which extends through the aluminium gallium nitride layer 46 and the gallium nitride layer 45 to the silicon carbide layer 43. The cathode 51 is electrically coupled to the silicon carbide layer 43 by an ohmic contact 58 which is formed to a highly doped region or well 56 of the silicon carbide layer 43 at the base of the via 55. The case of n-doped silicon nitride layer 43, the highly doped region 56 may be n$^+$-doped. The via 55 is at least partially filled with conductive material, such as a metal, which forms an ohmic contact 58 with the highly doped region 56 and the cathode of the lateral diode 41. The conductive material in the via 55 also electrically couples the drain 48 of the gallium nitride-based HEMT 42 with the two-dimensional electron gas 54.

The diode 41 is a lateral diode since the anode 50 and the cathode 51 are laterally spaced apart from one another and a lateral current path is formed in the silicon carbide layer 43 underneath the gallium nitride-based HEMT 42 which is substantially parallel to major surfaces 61, 62 of the semiconductor device 40. The gallium nitride-based HEMT 42 can be considered to be stacked on the diode 41.

An insulating layer 63 and/or passivation layer may be arranged on the Group III nitride-based barrier layer between the common electrodes 59, 60 and the gate 49.

The common source/anode electrode 59 may also be electrically coupled with the substrate 44 by a conductive connection which cannot be seen in the cross-sectional view of FIG. 3.

FIG. 4 illustrates a semiconductor device 40' according to a third embodiment including a lateral diode 41 coupled in parallel with a transistor device 42. The semiconductor device 40' according to the third embodiment differs from the semiconductor device 40 according to the second embodiment in that the semiconductor device 40' includes one or more further layer 64 arranged between the gallium nitride layer 45 and the silicon carbide layer 43. The further layer 61 may include aluminium gallium nitride or aluminium nitride or may include two or more sub layers. In an embodiment, the further layer 64 includes alternating stacks of aluminium gallium nitride and gallium nitride or of aluminium nitride and gallium nitride.

In embodiments in which the semiconductor device 40' includes a further layer 64 arranged between the gallium nitride layer 45 and the silicon carbide layer 43, the vias 52, 55 extend through the further layer 64 such that the metallic layer 53 providing the Schottky contact 57 is in direct contact with the silicon carbide layer 43 and the conductive material providing the cathode 48 and drain 51 is in direct contact with the highly doped region 58 of the silicon carbide layer 43.

Silicon carbide is useful substrate 44 for the epitaxial deposition of gallium nitride, since both silicon carbide and gallium nitride have a hexagonal crystal structure and epitaxial growth of gallium nitride on the silicon carbide layer may be promoted.

In the semiconductor devices 40, 40', the substrate 44 includes silicon carbide, in particular p-doped silicon carbide. In some embodiments, such as that illustrated in FIG. 5, the substrate 44 may include other materials such as silicon. Silicon may be a useful material for the substrate 63, since it is widely used for semiconductor devices and available in large diameters.

FIG. 5 illustrates a semiconductor device 40" according to a fourth embodiment including a diode 41 coupled in parallel with a transistor device 42. The semiconductor device 40" includes a substrate 44 including silicon and a further layer 65 which is arranged between the silicon carbide layer 43 and the silicon substrate 66. The further layer 65 may include silicon oxide SiO$_x$ or silicon dioxide. The further layer 65 may be used to prevent contamination of the silicon substrate 63 during growth of the silicon carbide layer 43 on the silicon substrate 63.

The semiconductor device is illustrated in FIGS. 1 to 5 each include a single transistor device stacked on a single lateral diode. However, the semiconductor device may also include more than one transistor device and more than one lateral diode. Furthermore, the semiconductor device may include a transistor device which is not stacked on a lateral diode and/or a lateral diode which is not arranged under a transistor device.

Figure 6:
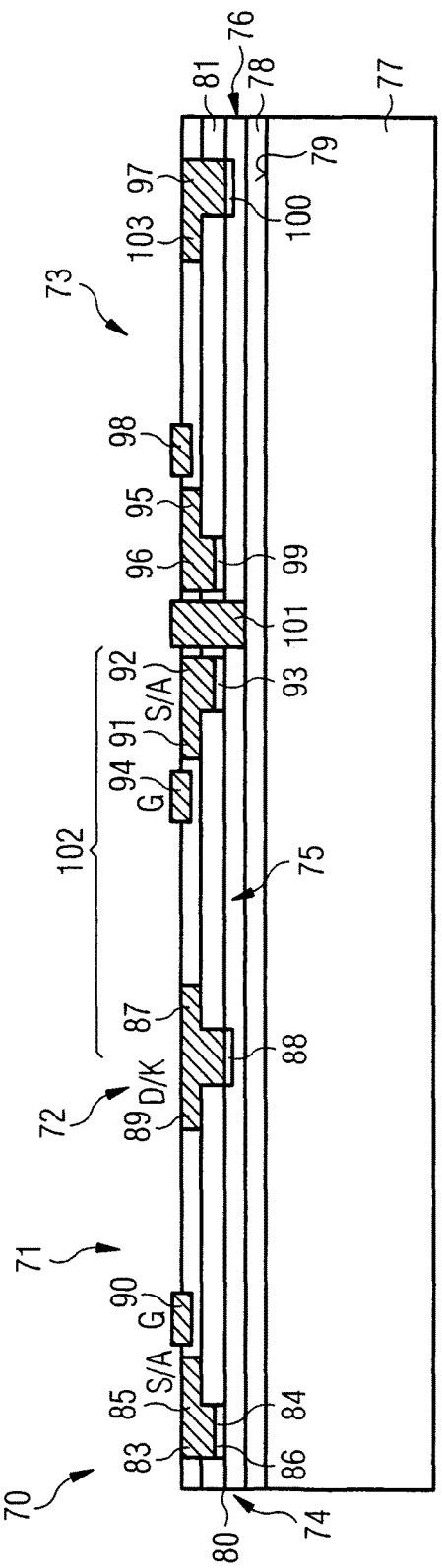
FIG. 6 illustrates a semiconductor device according to a fifth embodiment including a plurality of transistors and diodes.

FIG. 6 illustrates a semiconductor device 70 according to a fifth embodiment including a plurality of transistor devices 71, 72, 73 and a plurality of diodes 74, 75, 76 which are arranged on a common silicon substrate 77. A silicon oxide (SiO$_x$) layer 78 is arranged on first major surface 79 of the silicon substrate 77, a silicon carbide layer 80 is arranged on the silicon oxide layer 78 and two or more Group III nitride-based layers are arranged on the silicon carbide layer 80.

For example a gallium nitride layer may be arranged on the silicon carbide layer and an aluminium gallium nitride layer arranged on the gallium nitride layer to produce a heterojunction supporting a two dimensional electron gas (2DEG) formed by induced and spontaneous polarization at the interface between the gallium nitride layer and aluminium gallium nitride layer. The two or more Group III nitride-based layers may be epitaxially grown on the silicon carbide layer 80. In FIG. 6, the two or more Group III nitride-based layers are indicated schematically with reference number 81. The upper surface of the Group III nitride-based layers 81 may include a passivation layer and/or insulating layers.

The first transistor device 71 is stacked on, and coupled in parallel with, a first diode 74 using an arrangement similar to that disclosed in FIG. 5. The anode 83 of the lateral diode 74 is electrically coupled to the silicon carbide layer 80 by a Schottky contact 84 and by an ohmic contact the source 85 of the transistor device 71. The ohmic contact may be provided by a metal which is arranged at least partially on the Group III nitride-based layer 81 and is electrically coupled with the metallic layer 86 providing the Schottky contact 84.

The cathode 87 of the diode 74 is electrically coupled to a highly doped n$^+$ region 88 within the silicon carbide layer 80 and is coupled to the drain 89 of the transistor device 71 by a conductive layer arranged at least partially on the Group III nitride layer 81 and on the n$^+$-doped region 88. The gate electrode 90 of the first transistor device 71 is arranged on the Group III nitride-based layer 81 and is positioned laterally between the source 85 and drain 89 of the transistor device 71.

The second transistor device 72 includes the drain 89 of the first transistor device 71 and a source 91 spaced at a differential lateral distance from the drain 89. The second transistor device 72 is stacked on and coupled in parallel with the second diode 75. The second transistor device 72 also includes a gate 94 arranged laterally between the source 91 and the drain 89. The anode 92 of the second diode 75 is electrically coupled by Schottky contact 93 to the silicon carbide layer 80 and with the source 91 are coupled by an ohmic contact. The cathode of the second diode 75 is provided by the cathode 87 of the first diode.

The third transistor device 73 is stacked on and electrically coupled in parallel with the third diode 76. The transistor device 73 includes a source 95 which is electrically coupled with an anode 96 of the third lateral diode 76, a drain 103 which is electrically coupled to the cathode 97 of the lateral diode 76 and a gate 98 which is laterally arranged between the source 95 and the drain 103. The anode 96 of the third lateral diode 76 is coupled by a Schottky contact 100 to the silicon carbide layer 80 and the cathode 97 of the third lateral diode 76 is coupled by an ohmic contact with the silicon carbide layer 80.

Semiconductor device 70 may include trench isolation 101 positioned between the common source 91 and anode 92 of the second semiconductor device 72 and the source 95 of the third semiconductor device 73. The trench isolation 101 may include silicon oxide and may extend through the Group III nitride-based layers 81 and the silicon carbide layer 80 and be in direct contact with the underlying silicon oxide layer 78.

The trench isolation 101 may be used to form a shallow trench isolation and may be used to provide a blocking voltage of at least 1000 V.

The lateral diode 75 formed in the silicon carbide layer 80 may also be used to provide a lateral isolation pn isolation 102.

Figure 7:
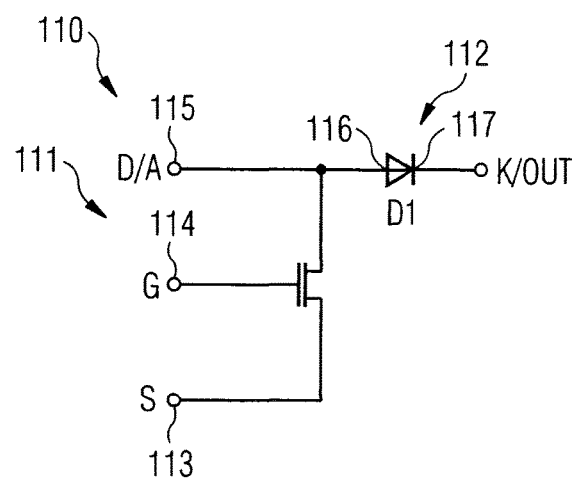
FIG. 7 illustrates a circuit diagram of a transistor device and a diode coupled in series.

FIG. 7 illustrates a circuit diagram 110 of a transistor device 111 and a diode 112 coupled in series. The transistor device 111 includes a source 113, a gate 114 and a drain 115. The anode 116 of the diode 112 is electrically coupled to the drain 115 and the cathode 117 of the diode 112 is electrically coupled to an output.

Figure 8:
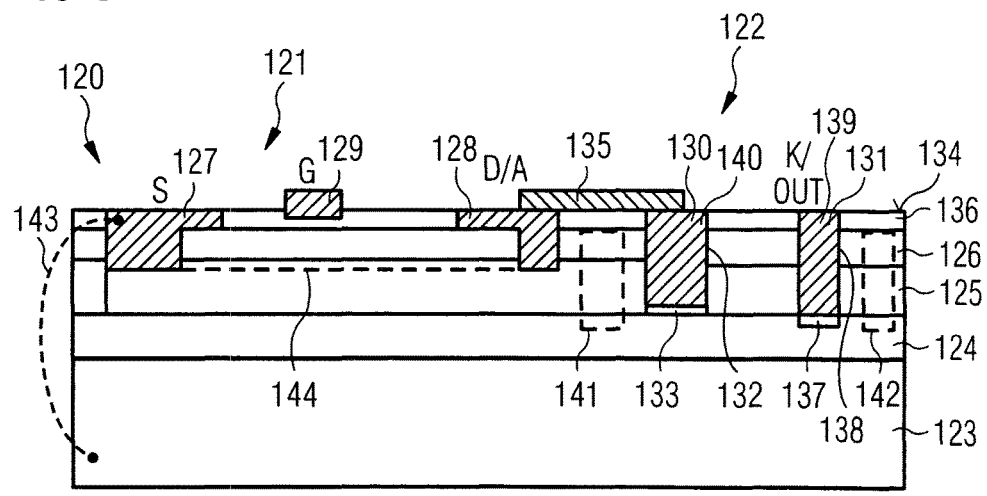
FIG. 8 illustrates a semiconductor device according to sixth embodiment including a transistor device and a diode coupled in series.
Figure 9:
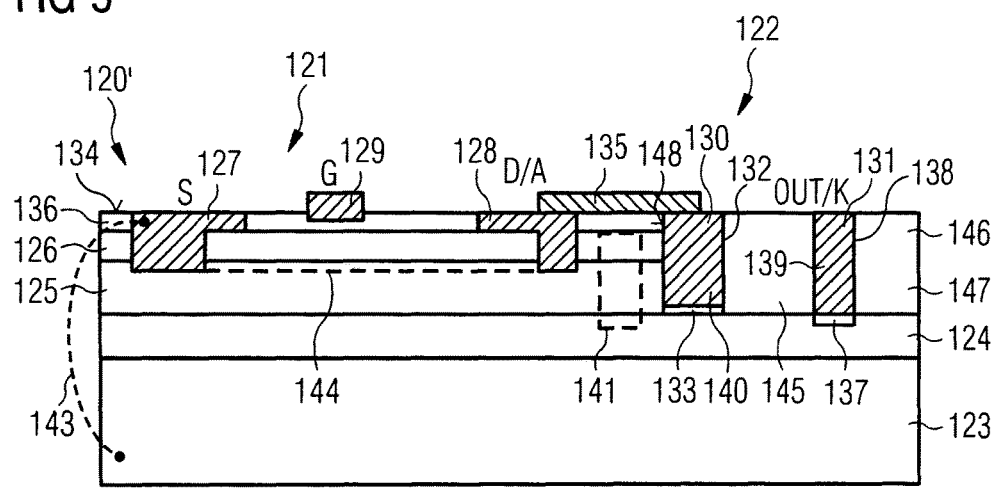
FIG. 9 illustrates a semiconductor device according to a seventh embodiment including a transistor device and a diode coupled in series.

FIGS. 8 and 9 illustrate semiconductor devices including a transistor device coupled in series with a diode.

FIG. 8 illustrates a semiconductor device 120 according to sixth embodiment including a transistor device 121 and a diode 122 coupled in series. The diode 122 may be arranged laterally adjacent the transistor device 121. The semiconductor device 120 includes a substrate 123 which may include silicon carbide, for example, p-doped silicon carbide. A silicon carbide layer 124 is arranged on the substrate 123. In embodiments in which the substrate 123 is p-doped silicon carbide, the silicon carbide layer 124 may include n-doped silicon carbide.

The transistor device 121 includes a Group III nitride-based transistor 121 which is positioned on the silicon carbide layer 124. The Group III nitride-based transistor 121 may be a High Electron Mobility Transistor (HEMT) and may include a gallium nitride layer 125 which is arranged on the silicon carbide layer 124 and an aluminium gallium nitride layer 126 arranged on the gallium nitride layer 125. The transistor device 121 supports a two dimensional electron gas (2DEG) 144 which is formed by induced and polarised and spontaneous polarisation at the interface between the aluminium gallium nitride layer 126 and the gallium nitride layer 125.

One or more further layers may be provided between the silicon carbide layer 124 and the gallium nitride layer 125. These further one or more layers may act as buffer layers and may include gallium aluminium nitride, or aluminium nitride or alternating layers of aluminium gallium nitride and gallium nitride, for example.

The transistor device 121 includes a source 127 and a drain 128 and a gate 129 arranged between the source 127 and the drain 128. The source 127 and the drain 128 may be arranged on the aluminium gallium nitride layer 126 or may extend through the aluminium gallium nitride layer and be coupled directly to the two-dimensional electron gas 144. The gate 129 may be arranged directly on the aluminium gallium nitride layer 126 or may include a gate oxide or a p-type gallium nitride layer between the gate 129 and the aluminium gallium nitride layer 126. The gate 129 may include a recessed gate structure.

The diode 122 includes an anode 130 and a cathode 131 which are arranged laterally adjacent one another. The anode 130 includes Schottky contact with the silicon carbide layer 124 which may be produced by introducing a via 132 through the aluminium gallium nitride layer 126 and the gallium nitride layer 125 to expose a region of the silicon carbide layer 124 and depositing a suitable metal 133 on at least the surface region of the silicon carbide layer to form a Schottky contact. The anode 130 may be arranged laterally adjacent the drain 128 of the transistor device 121.

The anode 130 may include a conductive via 140 which extends from the metal 133 to the upper surface 134 of the semiconductor device 120. The anode 130 may be electrically coupled with the drain 128 of the transistor device 121 by a conductive layer 135 arranged on an insulation layer 136 arranged on the aluminium gallium nitride layer 126. The conductive layer 135 may include a metal such as copper, for example. The cathode of the lateral diode 122 is arranged laterally the anode 130 and is electrically coupled by an ohmic contact to the silicon carbide layer 124. This may be achieved by providing a highly doped region 137 in the silicon carbide layer 124 at the interface with the gallium nitride layer 125 and the silicon carbide layer 124. The ohmic contact may be produced by exposing the highly doped region 137 in the base of a via 138, introducing conductive material 139, such as a metal into the via. The conductive material extends to the upper surface 134 of the semiconductor device 120 and provides an output.

Additionally, further isolation may be provided for example, electrical isolation 141 may be provided between the drain 128 and the anode 130. The electrical isolation 141 may be formed by introducing a trench from the outermost surface which extends through the aluminium gallium nitride layer 126 and gallium nitride 125 into the silicon carbide layer 124. The trench may be at least partially filled by an insulating material such as silicon dioxide. A further isolation structure 142 may be provided on the opposing lateral side of the lateral diode 122, peripheral to the output node.

Optionally, the source 127 may be electrically coupled with the substrate 123 as is indicated by the dashed line 143.

In the semiconductor device 120, the gallium nitride layer 125 and aluminium gallium nitride layer 126 are arranged on top of the region of the silicon carbide layer 124 in which the lateral diode 122 is arranged.

FIG. 9 illustrates a semiconductor device 120' according to a seventh embodiment including a transistor device 121 and a diode 122 coupled in series. The semiconductor device 120' according to the seventh embodiment differs from the semiconductor device 120 according to the sixth embodiment in that the gallium nitride layer 125 and the aluminium gallium nitride layer 126 extend above the region of the silicon carbide layer 124 in which the lateral diode 122 is arranged. In particular, the region 145 between the anode 130 and cathode 131 and the region 146 peripheral to the cathode 131 are uncovered by the gallium nitride layer 126 and the aluminium gallium nitride layer 126. In these regions 145, 146, the silicon carbide layer 124 may be covered by the passivation layer and/or insulating layer 147. The insulation layer 144 may have a thickness which is less than the thickness of the transistor 121 so that the anode 130 may be considered to be arranged on a side face 148 of the transistor device 121.

Figure 10:
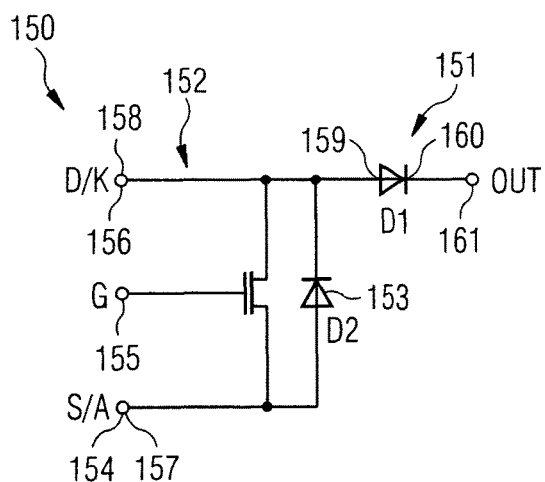
FIG. 10 illustrates a circuit diagram including a first diode coupled in series with a transistor device and the second diode coupled in parallel with the transistor device.

FIG. 10 illustrates a circuit diagram of a circuit 150 including a first diode 151 coupled in series with a transistor device 152 and a second diode 153 coupled in parallel with the transistor device 152. The transistor device 152 includes a source 154, a gate 155 and a drain 156. The source 154 is electrically coupled with an anode 157 of the second diode 153. A cathode 158 of the second diode 153 is electrically coupled to the drain 156 to couple the second diode 153 in series with the transistor device 152. An anode 159 of the first diode 151 is electrically coupled with the drain 156 of the transistor device 152 and the cathode 158 of the second diode 153. A cathode 160 of the first diode 151 is electrically coupled to an output 161 to electrically couple the first diode 151 in series with the transistor device 152.

Figure 11:
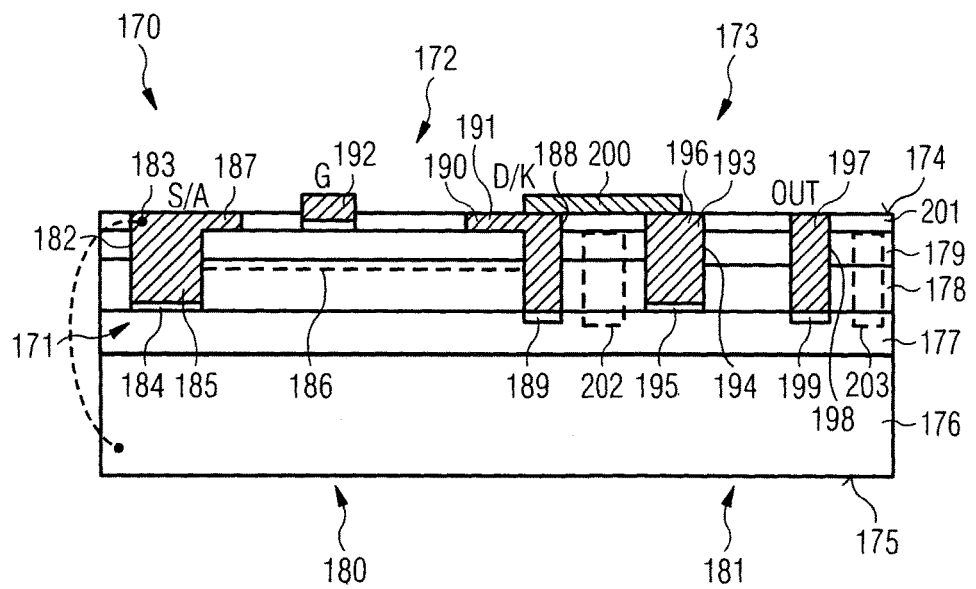
FIG. 11 illustrates a semiconductor device according to an eighth embodiment including a first diode coupled in series with a transistor device and a second diode coupled in parallel with a transistor device.

FIG. 11 illustrates a semiconductor device 170 according to an eighth embodiment including a first diode 171 coupled in parallel with a transistor device 172 and a second diode 173 coupled in series with the transistor device 172.

The first diode 171 and the second diode 173 are lateral diodes, each having a current path which is substantially parallel to the major surfaces 174, 175 of the semiconductor device 170. The transistor device 172 includes a Group III nitride-based HEMT.

The first lateral diode 171, the second lateral diode 173 and the transistor device 172 are arranged on a common substrate 176. In this embodiment, the substrate 176 includes p-doped silicon carbide. A silicon carbide layer 177 which is n-doped is arranged on the substrate 176 and two or more Group III nitride-based layers are arranged on the silicon carbide layer 177 to form the Group III nitride-based HEMT 172. In the illustrated embodiment, a layer including gallium nitride 178 is arranged on the silicon carbide layer 177 and a layer including aluminium gallium nitride 179 is arranged on the gallium nitride layer 178. One or more further layers may also be arranged between the gallium nitride layer 178 and the silicon carbide layer 177. One or more further layers, for example an aluminium nitride cap layer, may be arranged on the aluminium gallium nitride layer 179.

The transistor device 172 is formed in a first region 180 of the semiconductor device 170 and the second diode 173 which is coupled in series with the transistor device 172 is arranged in a second region 181 of the semiconductor device 170 adjacent the transistor device 172. The transistor device 172 is stacked on the first diode 171 and arranged adjacent the second diode 173. The first diode 171 and the second diode 173 are arranged adjacent one another.

The silicon carbide layer 177 may be used to assist in the epitaxial growth of the gallium nitride layer 178 on the silicon carbide layer 177 as both gallium nitride and silicon carbide include a hexagonal crystal structure. After deposition of the layers for the HEMT, vias may be formed through the layers of the HEMT in order to provide connections to the underlying silicon carbide layer 177 to form the first diode 171 and the second diode 173 and to form the electrodes of the transistor device 172.

A first via 182 may be formed which extends through the aluminium gallium nitride layer 179 and the gallium nitride layer 178 to the silicon carbide layer 177 such that the base of the via 182 is formed by silicon carbide. A Schottky contact with the silicon carbide layer 177 provides the anode 183 of the first lateral diode 171 may be formed by depositing a layer 184 including a suitable metal at the base of the via 182. A further metal 185 may be introduced into the via which forms an ohmic contact with the two-dimensional electron gas 186 which is formed by induced and spontaneous polarisation at the interface between the gallium nitride layer 178 and the aluminium gallium nitride layer 179 and which forms the source 187 of the transistor device 172. The metal 185 also electrically couples the source 187 with the anode 183 and provides a common source/anode electrode.

A second via 188 may be used to form a common drain/cathode electrode which is spaced apart from the first via 182. The via 188 extends through the aluminium gallium nitride layer 179 and gallium nitride layer 178 such that the base is formed by silicon carbide. In particular, the region 189 of the silicon carbide layer 177 at the base of the via 188 is highly n doped such that an ohmic contact can be formed to the silicon carbide layer 177 by conductive material, for example a metal, introduced into the via 188. The metal is also electrically coupled to the two dimensional electron gas 186 and thus forms the drain 190 of the transistor device 172 and the cathode 191 of the first lateral diode 171.

A gate 192 is arranged between the source 187 and the drain 190. The gate 192 may be arranged directly on the aluminium gallium nitride layer 179. In some embodiments, a further layer which may be a gate insulation layer, such as a gate oxide, or a p-doped gallium nitride layer to provide a normally off transistor, may be included between the gate 192 and the aluminium gallium nitride layer 179. The gate 192 may also include a recessed gate structure. The first lateral diode 171 is arranged underneath the transistor device 172 and is electrically coupled in parallel with the transistor device 172 since its anode 183 is electrically coupled to the source 187 and its cathode 191 is electrically coupled to the drain 190 of the transistor device 172.

The anode 193 of the second lateral diode 173 are formed by a via 194 which extends through the aluminium gallium nitride layer 179 gallium nitride layer 178 such that the base of the via 194 is formed by the silicon carbide layer 177. A Schottky contact to the silicon carbide layer 177 is formed by a layer 195 of the suitable metal which is in direct contact with silicon carbide layer 177. The via 194 includes a metal 196 which is suitable for forming an ohmic contact with the common drain cathode electrode of the transistor device 172. The cathode 197 of the second lateral diode 173 is formed by inserting a via 198 which is laterally spaced apart from the via 194. The via 198 extends through the aluminium gallium nitride layer 179 gallium nitride layer 178 and has a base formed by a highly doped region 199 of the silicon carbide layer 177. The highly-doped region 199 is electrically coupled to the conductive material, for example a metal, arranged in the via 198 by an ohmic contact.

The anode 193 of the second lateral diode 173 is electrically coupled to the drain 190 of the transistor device 172 and the cathode 191 and the first lateral diode 171 by a further conductive layer 200 which is arranged on an insulating layer 201 arranged on the aluminium gallium nitride layer 179.

The uppermost surfaces of the metal inserted in the vias remain exposed from the insulating layer 201 and may extend over the aluminium gallium nitride layer 179 to provide an increased contact area.

Optionally, the semiconductor device 170 may include insulation between the stack including the transistor device 172 and the lateral diode 171 coupled in parallel and the second lateral diode 173 which is coupled in series with the transistor device 172. The insulation may be formed by introducing a trench 202 between the via 188 forming the drain 190/cathode 191 and the via 194 for the anode 193 of the second lateral diode 173 and introducing insulating material, such as $SiO_x$ into the trench 202. The semiconductor device 170 may also include insulation at the periphery adjacent the outwardly facing side face of the cathode 197 which provides the output node of the circuit. The further insulation 203 may also include a trench including insulating material.

Figure 12:
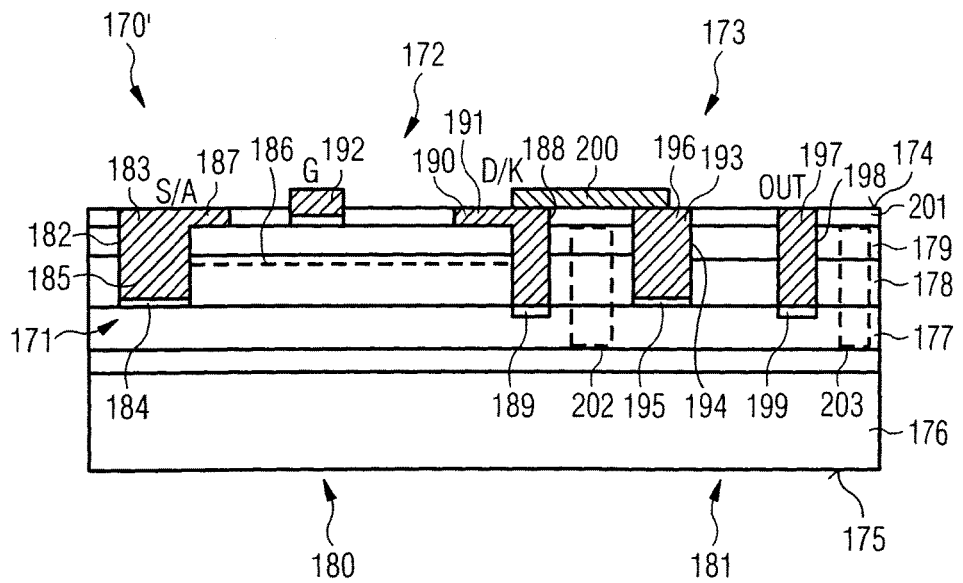
FIG. 12 illustrates a semiconductor device according to a ninth embodiment including a first diode coupled in series with a transistor device and a second diode coupled in parallel with a transistor device.

FIG. 12 illustrates a semiconductor device 170' according to a ninth embodiment including a first diode 171 coupled in parallel with a transistor device 172 and a second diode 173 coupled in parallel with the transistor device 172.

The semiconductor device 170' according to the ninth embodiment differs from the semiconductor device 170 of the eighth embodiment in the form of the substrate 176. In the embodiment illustrated in FIG. 12, the substrate 176 includes silicon and a further layer 210 including silicon dioxide is arranged between the substrate 176 and the silicon carbide layer 177.

The insulation trenches 202, 203, if used, may extend through the entire thickness of the silicon carbide layer 177 such that the base is formed by the silicon dioxide layer 210. This arrangement may be used to further improve the insulation.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and de-scribed herein, it will be appreciated by those of ordinary skill in the art that a variety of alternate and/or equivalent implementations may be substituted for the specific embodiments shown and described without departing from the scope of the present invention. For example, the potential distribution can be achieved through ion implantation into an inter-layer dielectric (ILD) formed below the gate electrode, too. This application is intended to cover any adaptations or variations of the specific embodiments discussed herein. Therefore, it is intended that this invention be limited only by the claims and the equivalents thereof.

What is claimed is:

1. A semiconductor device, comprising:
   a silicon carbide layer comprising a lateral diode; and
   a Group III nitride based semiconductor device arranged on the silicon carbide layer,
   wherein the lateral diode forms a lateral current path in the silicon carbide layer,
   wherein the lateral current path is substantially parallel to major surfaces of the Group III nitride based semiconductor device,
   wherein the lateral diode is coupled in series with the Group III nitride based semiconductor device.

2. The semiconductor device according to claim 1, wherein the Group III nitride based semiconductor device comprises a transistor device.

3. The semiconductor device according to claim 1, wherein the Group III nitride based semiconductor device comprises a High Electron Mobility Transistor.

4. The semiconductor device according to claim 1, wherein the silicon carbide layer is arranged on an insulation layer.

5. The semiconductor device according to claim 4, wherein the insulation layer is arranged on a substrate.

6. A semiconductor device, comprising:
a silicon carbide layer comprising a lateral diode; and
a Group III nitride based semiconductor device arranged on the silicon carbide layer,
wherein the lateral diode forms a lateral current path in the silicon carbide layer,
wherein the lateral current path is substantially parallel to major surfaces of the Group III nitride based semiconductor device,
wherein the Group III nitride based semiconductor device comprises a transistor comprising a source and a drain,
wherein the lateral diode is coupled in a parallel circuit between the source and the drain of the transistor.

7. A semiconductor device, comprising:
a silicon carbide layer comprising a lateral diode; and
a Group III nitride based semiconductor device arranged on the silicon carbide layer,
wherein the lateral diode forms a lateral current path in the silicon carbide layer,
wherein the lateral current path is substantially parallel to major surfaces of the Group III nitride based semiconductor device,
wherein the lateral diode comprises an anode coupled by a Schottky contact with the silicon carbide layer and a cathode coupled by an ohmic contact with the silicon carbide layer.

8. The semiconductor device according to claim 7, wherein the anode is coupled with a source of the Group III nitride based semiconductor device.

9. The semiconductor device according to claim 8, wherein the cathode is coupled with a drain of the Group III nitride based semiconductor device.

10. The semiconductor device according to claim 7, wherein the anode is coupled with a drain of the Group III nitride based semiconductor device.

11. The semiconductor device according to claim 10, wherein the cathode is coupled with an output of the Group III nitride based semiconductor device.

12. A semiconductor device, comprising:
a silicon carbide layer comprising a lateral diode; and
a Group III nitride based semiconductor device arranged on the silicon carbide layer,
wherein the silicon carbide layer is arranged on an insulation layer opposite the silicon carbide layer from the Group III nitride based semiconductor device,
wherein the insulation layer is arranged between the silicon carbide layer and a substrate,
wherein the insulation layer comprises silicon oxide-and the substrate comprises silicon.

13. A semiconductor device, comprising:
a silicon carbide layer comprising a first lateral diode and a second lateral diode; and
a Group III nitride based semiconductor device arranged on the silicon carbide layer,
wherein the first lateral diode is coupled in parallel with the Group III nitride based semiconductor device and the second lateral diode is coupled in series with the Group III nitride based semiconductor device,
wherein each of the first lateral diode and the second lateral diode forms a lateral current path in the silicon carbide layer,
wherein the lateral current path is substantially parallel to major surfaces of the Group III nitride based semiconductor device.

14. The semiconductor device according to claim 13, wherein the Group III nitride based semiconductor device comprises a High Electron Mobility Transistor.

15. The semiconductor device according to claim 13, wherein the first lateral diode is arranged under the Group III nitride based semiconductor device and the second lateral diode is arranged adjacent the Group III nitride based semiconductor device.

16. The semiconductor device according to claim 13, wherein the first lateral diode comprises an anode and a cathode, wherein the anode coupled by a Schottky contact with the silicon carbide layer and coupled by an ohmic contact to a source of the Group III nitride based semiconductor device and the cathode coupled by an ohmic contact with the silicon carbide layer and with a drain of the Group III nitride based semiconductor device.

17. A semiconductor device, comprising:
a silicon carbide layer comprising a first lateral diode and a second lateral diode; and
a Group III nitride based semiconductor device arranged on the silicon carbide layer,
wherein the first lateral diode is coupled in parallel with the Group III nitride based semiconductor device and the second lateral diode is coupled in series with the Group III nitride based semiconductor device,
wherein an anode of the first lateral diode is coupled to a source of the Group III nitride based semiconductor device, a cathode of the first lateral diode is coupled to a drain of the Group III nitride based semiconductor device, an anode of the second lateral diode is coupled to a drain of the Group III nitride based semiconductor device and a cathode of the second lateral diode provides an output node.

18. A semiconductor device, comprising:
a silicon carbide layer comprising a first lateral diode and a second lateral diode; and
a Group III nitride based semiconductor device arranged on the silicon carbide layer,
wherein the first lateral diode is coupled in parallel with the Group III nitride based semiconductor device and the second lateral diode is coupled in series with the Group III nitride based semiconductor device,
wherein the second lateral diode comprises an anode and a cathode, wherein the anode is coupled by a Schottky contact with the silicon carbide layer and by an ohmic contact with a drain of the Group III nitride based semiconductor device and the cathode is coupled by an ohmic contact with an output of the Group III nitride based semiconductor device.

* * * * *

UNITED STATES PATENT AND TRADEMARK OFFICE
CERTIFICATE OF CORRECTION

PATENT NO. : 10,153,276 B2
APPLICATION NO. : 14/573062
DATED : December 11, 2018
INVENTOR(S) : Mauder et al.

Page 1 of 1

It is certified that error appears in the above-identified patent and that said Letters Patent is hereby corrected as shown below:

In the Claims

Column 13, Line 54 (Claim 12, Line 10) please change "oxide-and" to -- oxide and --

Signed and Sealed this
Twenty-sixth Day of February, 2019

Andrei Iancu
*Director of the United States Patent and Trademark Office*